United States Patent
Pai et al.

(10) Patent No.: US 7,032,758 B2
(45) Date of Patent: Apr. 25, 2006

(54) WORKPIECE HOLDER FOR CLEAN CONTAINER

(75) Inventors: Wei-Ming Pai, Changhua (TW); Dar-Zen Chen, Taipei (TW); Jyh-Jone Lee, Hsinchu (TW); Tzong-Ming Wu, Taipei (TW); Hui-Chih Lin, Taipei (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 120 days.

(21) Appl. No.: 10/781,777

(22) Filed: Feb. 20, 2004

(65) Prior Publication Data
US 2005/0087476 A1    Apr. 28, 2005

(30) Foreign Application Priority Data
Oct. 27, 2003  (TW) .............................. 92129745 A

(51) Int. Cl.
*B65D 85/30*  (2006.01)
(52) U.S. Cl. ..................... 206/710; 206/454; 211/41.18
(58) Field of Classification Search ........ 206/710–711, 206/454; 211/41.18; 414/416.03, 416.08, 414/217, 217.1
See application file for complete search history.

(56) References Cited

U.S. PATENT DOCUMENTS

| | | | |
|---|---|---|---|
| 4,739,882 A * | 4/1988 | Parikh et al. | 206/454 |
| 4,815,912 A * | 3/1989 | Maney et al. | 414/217.1 |
| 5,452,795 A * | 9/1995 | Gallagher et al. | 206/711 |
| 5,890,597 A * | 4/1999 | Fan et al. | 206/710 |
| 5,960,959 A * | 10/1999 | Wu et al. | 206/710 |

* cited by examiner

*Primary Examiner*—Bryon P. Gehman
(74) *Attorney, Agent, or Firm*—Rabin & Berdo, P.C.

(57) ABSTRACT

A workpiece holder is provided inside a clean container such that when covering a housing of the clean container on a base of the clean container, the vertical slide of the workpiece holder is stopped at the base, and a locating member is continuously lowered with the housing, thereby causing the vertical slide to slide upwardly along the locating member and to turn a link, and then causing a holder member to be driven by the link to force a thrust face against workpieces, and therefore the workpieces are pushed into position in a cassette on the base. Because the vertical slide does not displace relative to the base when covering the housing on the base, neither friction nor particles are produced, and workpieces are well protected against contamination.

10 Claims, 5 Drawing Sheets

WORKPIECE HOLDER FOR CLEAN CONTAINER

BACKGROUND OF THE INVENTION

1. Field of the Invention

The present invention relates to a workpiece holder for clean container and, more particularly to such a workpiece holder, which is practical for use in a clean container to hold workpieces horizontally in position.

2. Description of Related Art

In semiconductor foundries, produced wafers are horizontally arranged in a cassette, which has supporting flanges for holding a number of wafers in horizontal. The cassette can be mounted on the base of a wafer container, for example, a POD or FOUP, and then covered by the housing of the wafer container for transfer. The housing protects wafers against contamination.

When carrying the wafers in the cassette inside the wafer container, wafers may displace during transfer of the wafer container. In order to eliminate this problem, a positioning structure is used in the wafer container. When covering the housing of the wafer container on the cassette on the base, a slide is against at the base of the wafer container, and then the base pushed the slide and to move a holder member forwards, causing the holder member to hold down loaded wafers. According to this design, a friction is produced between the slide and the base when the base pushing the slide, and such friction causes particles that may contaminate loaded wafers.

Except the aforesaid wafer container, some other clean containers for carrying photo masks, glass substrates, and other workpieces may have the same problem.

SUMMARY OF THE INVENTION

The present invention has been accomplished under the circumstances in view. It is the main object of the present invention to provide a workpiece holder for clean container, which uses a linking mechanism to prevent the occurrence of friction and the production of particles when covering the housing of the clean container, keeping the workpieces well protected against contamination.

To achieve this and other objects of the present invention, the workpiece holder is used in a clean container, which comprises a base, a cassette, and a housing, wherein the cassette fixedly provided at the top side of the base and adapted to hold a number of workpieces that are transversely insertable into the cassette, the housing adapted to cover the base over the cassette.

The workpiece holder is comprised of a locating member, a vertical slide, a holder member, and a link. The locating member is fixedly fastened to the inside wall of the housing of the clean container, having a vertical sliding groove and horizontal knuckle means. The vertical slide is vertically movably inserted into the vertical sliding groove of the locating member, having a transversely horizontal sliding groove. The holder member is set between the locating member and the cassette, comprising a thrust face, a horizontal sliding block, and horizontal knuckle means, wherein the thrust face disposed at the front side of the holder member and adapted to push the workpieces in the cassette into position, the horizontal sliding block backwardly extended from the back side of the holder member and movably inserted into the corresponding horizontal sliding groove of the vertical slide. The link has a first pivot, and a second pivot, wherein the first pivot pivoted with the horizontal knuckle means of the locating member, the second pivot pivoted with the horizontal knuckle means of the holder member.

When covering the housing on the base, a bottom side of the vertical slide is stopped at the top side of the base, and the locating member is continuously lowered with the housing, thereby causing the vertical slide to slide upwardly along the vertical sliding groove of the locating member, so as to turn the link upwardly subject to the first pivot, and at the same time the horizontal sliding block of the holder member slides forward in the horizontal sliding groove of the vertical slide, and the thrust face of the holder member pushes the inserted workpieces in the cassette into position.

When stopping the bottom side of the vertical slide against the top side of the base of the clean container, the vertical slide is contacted with the base in a specific point, the vertical slide does not displace relative to the base, therefore no friction is produced between the vertical slide and the base. Because no friction is produced between the vertical slide and the base, no particles are produced when covering the housing to set workpieces into position in the cassette, workpieces are well protected in the clean container against contamination.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
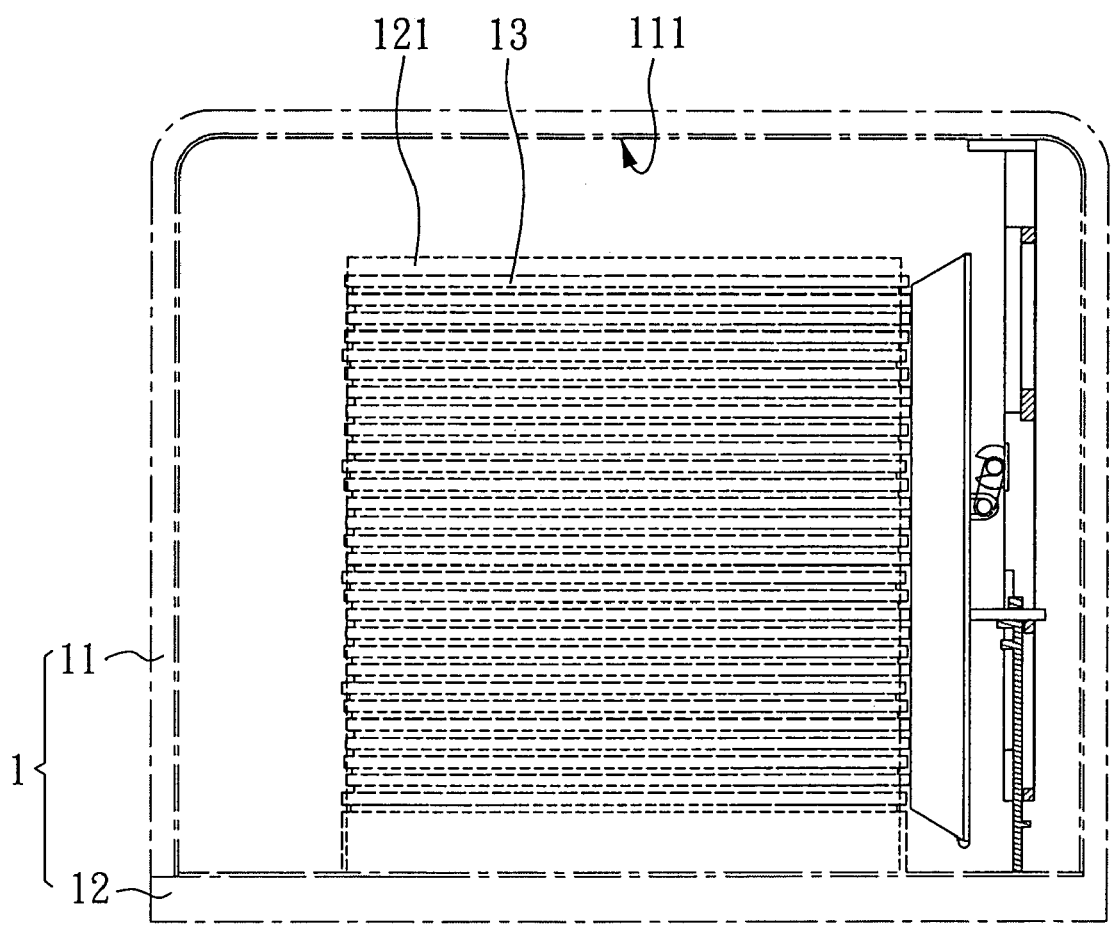
FIG. 1 is an applied view showing a workpiece holder used in a clean container according to the present invention.

Referring to FIG. 1, a clean container (for example, a SMIF FOUP) 1 is shown comprising a base 12, a cassette 121 fixedly provided at the top side of the base 12 and holding a plurality of wafers (workpieces) 13 that are transversely inserted into the cassette 121, and a housing 11 covering the base 12 over the cassette 121.

Figure 2:
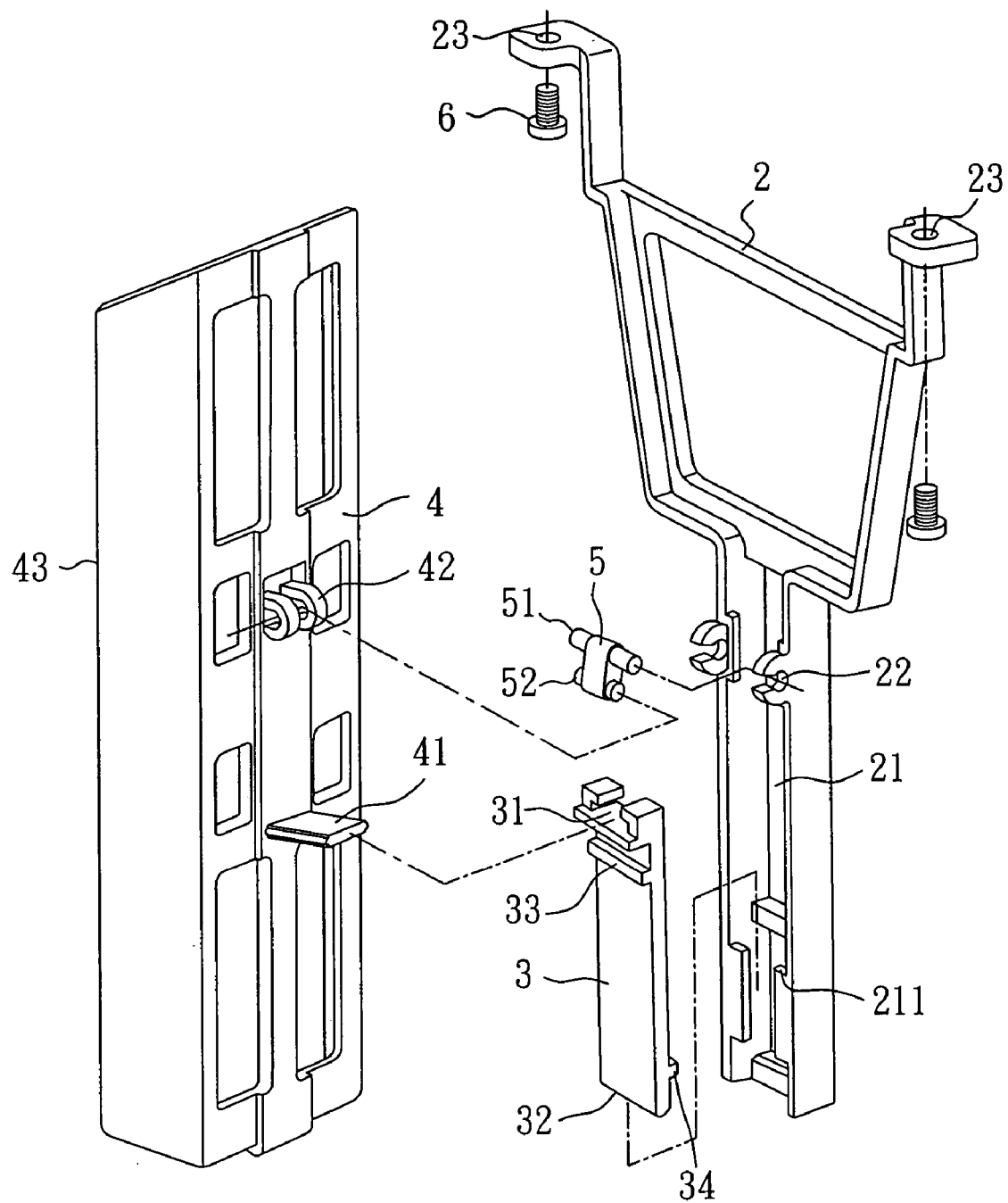
FIG. 2 is an exploded view of the workpiece holder used in the clean container shown in FIG. 1.

Referring to FIG. 2 and FIG. 1 again, the workpiece holder used in the aforesaid clean container 1 is comprised of a locating member 2, a vertical slide 3, a holder member 4, and a link 5. The locating member 2 is fixedly fastened to the inside wall 111 of the housing 11 of the clean container 1. According to this embodiment, the locating member 2 has two mounting holes 23 bilaterally disposed at the top side thereof and fastened to the inside wall 111 of the housing 11 of the clean container 1 with two screws 6 respectively. The locating member 2 has a vertical sliding groove 21, and horizontal knuckles 22 horizontally disposed in front of the vertical sliding groove 21, and a first stop for example, two vertical stop flanges 211 symmetrically disposed at two lateral edges of the vertical sliding groove 21, and a second stop for example, a horizontal stop flange 212 disposed inside the vertical sliding groove 21 below the vertical stop flanges 211.

The vertical slide 3 is vertically slidably inserted into the vertical sliding groove 21 of the locating member 2, and has a horizontal sliding groove 31 transversely disposed at the top side, a first stop flange 33 protruded from the front side near the top (horizontal sliding groove 31) for downwardly stopping at the vertical stop flanges 211 of the locating member 2 to limit downward moving distance of the vertical slide 3 when sliding in the vertical sliding groove 21, and to prevent falling of the vertical slide 3 out of the vertical sliding groove 21 of the locating member 2, and a second stop flange 34 protruded from the back side near the bottom for upwardly stopping at the horizontal stop flange 212 to limit upward moving distance of the vertical slide 3 in the vertical sliding groove 21.

The holder member 4 is a substantially U-shaped plate member set between the locating member 2 and the cassette 121, and has a thrust face 43 symmetrically bilaterally disposed at the front side corresponding to the wafers 13 in the cassette 121, a horizontal sliding block 41 perpendicularly extended from the back side and inserted into the corresponding horizontal sliding groove 31 of the vertical slide 3, and horizontal knuckles 42 horizontally aligned at the back side and spaced above the horizontal sliding block 41 at a pre-determined distance.

The link 5 comprises a first pivot 51 pivoted with the horizontal knuckles 22 of the locating member 2, and a second pivot 52 pivoted with the horizontal knuckles 42 of the holder member 4.

Figure 3:
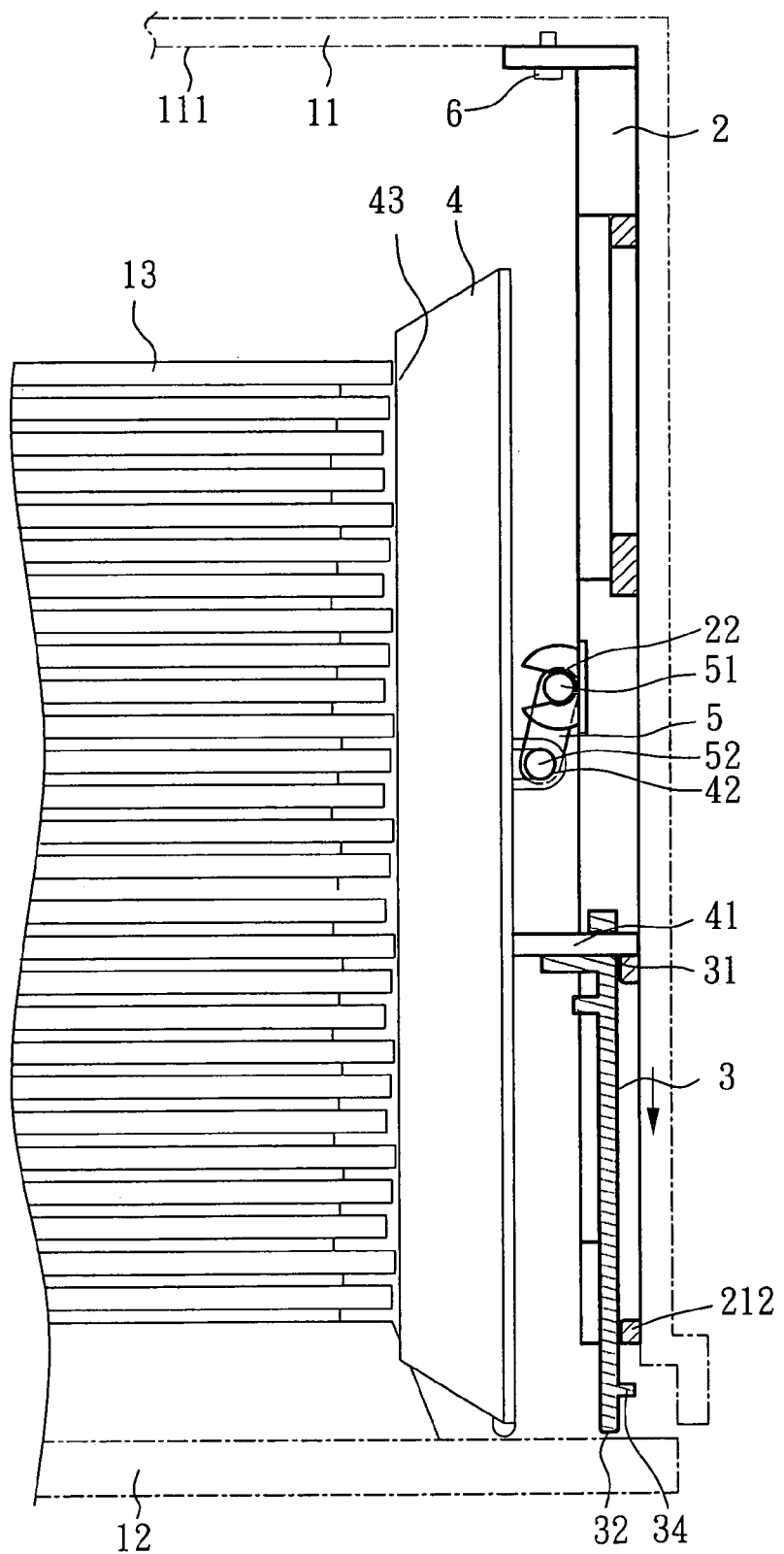
FIG. 3 is a schematic drawing showing the action of the workpiece holder according to the present invention (I).
Figure 4:
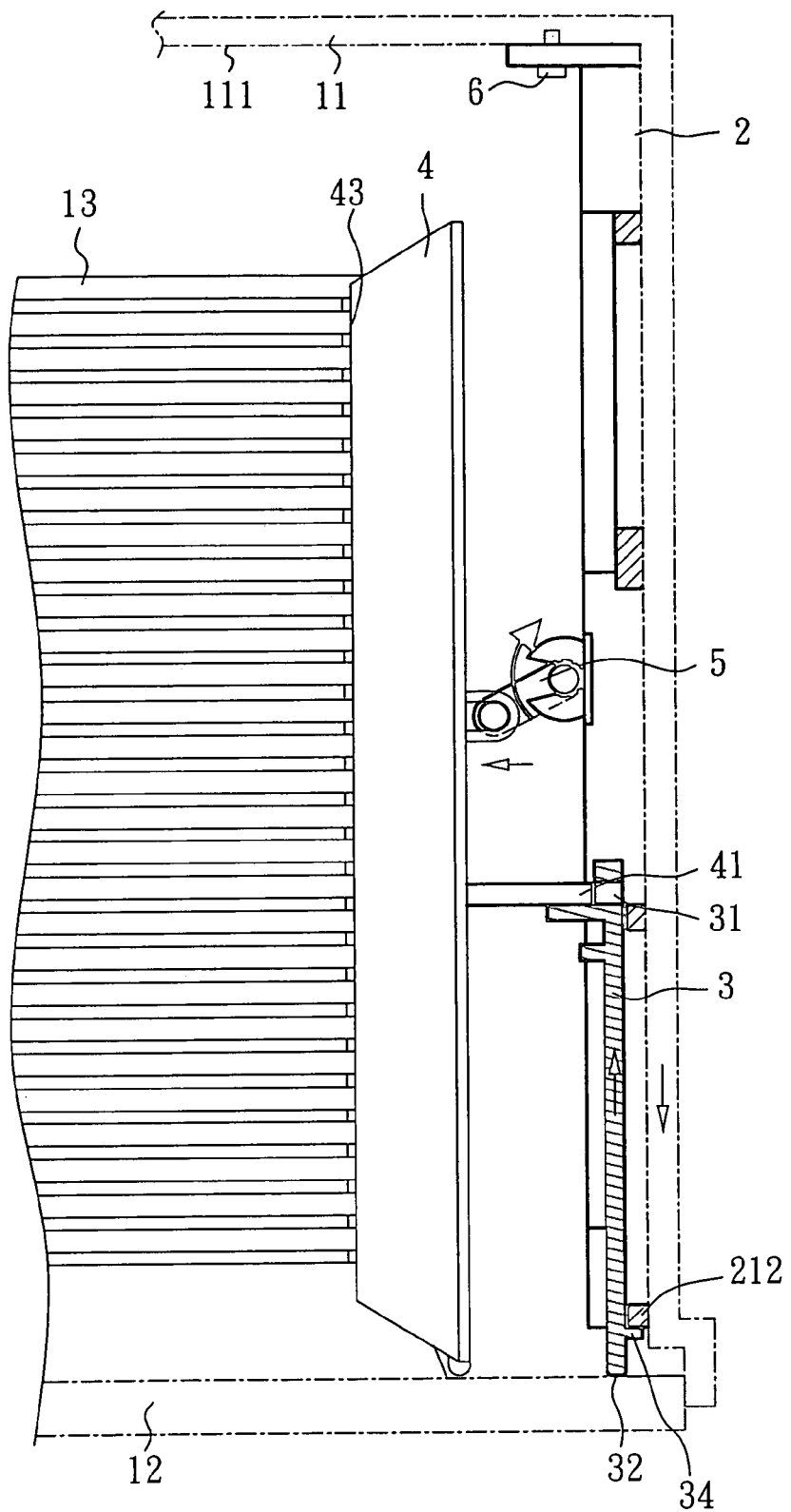
FIG. 4 is a schematic drawing showing the action of the workpiece holder according to the present invention (II).

Referring to FIG. 4 and FIGS. 2 and 3 again, when covering the housing 11 on the base 12, the bottom side 32 of the vertical slide 3 is stopped at the top side of the base 12 at first (see FIG. 3), and then the vertical slide 3 is forced to slide upwardly along the vertical sliding groove 21 of the locating member 2 till the second stop flange 34 of the vertical slide 3 is stopped at the bottom side of the horizontal stop flange 212, and at the same time the link 5 is forced to turn upwardly about the axis of the first pivot 51, causing the horizontal sliding block 41 of the holder member 4 to slide forward along the horizontal sliding groove 31 of the vertical slide 3, and therefore the thrust faces 43 of the holder member 4 are forced to push the inserted wafers 13 in the cassette 121 into position.

When stopping the bottom side 32 of the vertical slide 3 against the top side of the base 12 of the clean container 1, the vertical slide 3 does not displace relative to the base 12, and both the vertical slide 3 and the base 12 are maintained in contact with each other at a specific point. By means of the linking mechanism formed of the horizontal sliding groove 31 of the vertical slide 3, the horizontal sliding block 41 of the holder member 4, and the link 5, the workpiece holder automatically pushes wafers 13 into position in the cassette 121. Because no friction is produced between the vertical slide 3 and the base 12, no particles are produced when covering the housing 11 to set wafers 13 into position in the cassette 121, wafers 13 are well protected in the clean container 1 against contamination.

Figure 5:
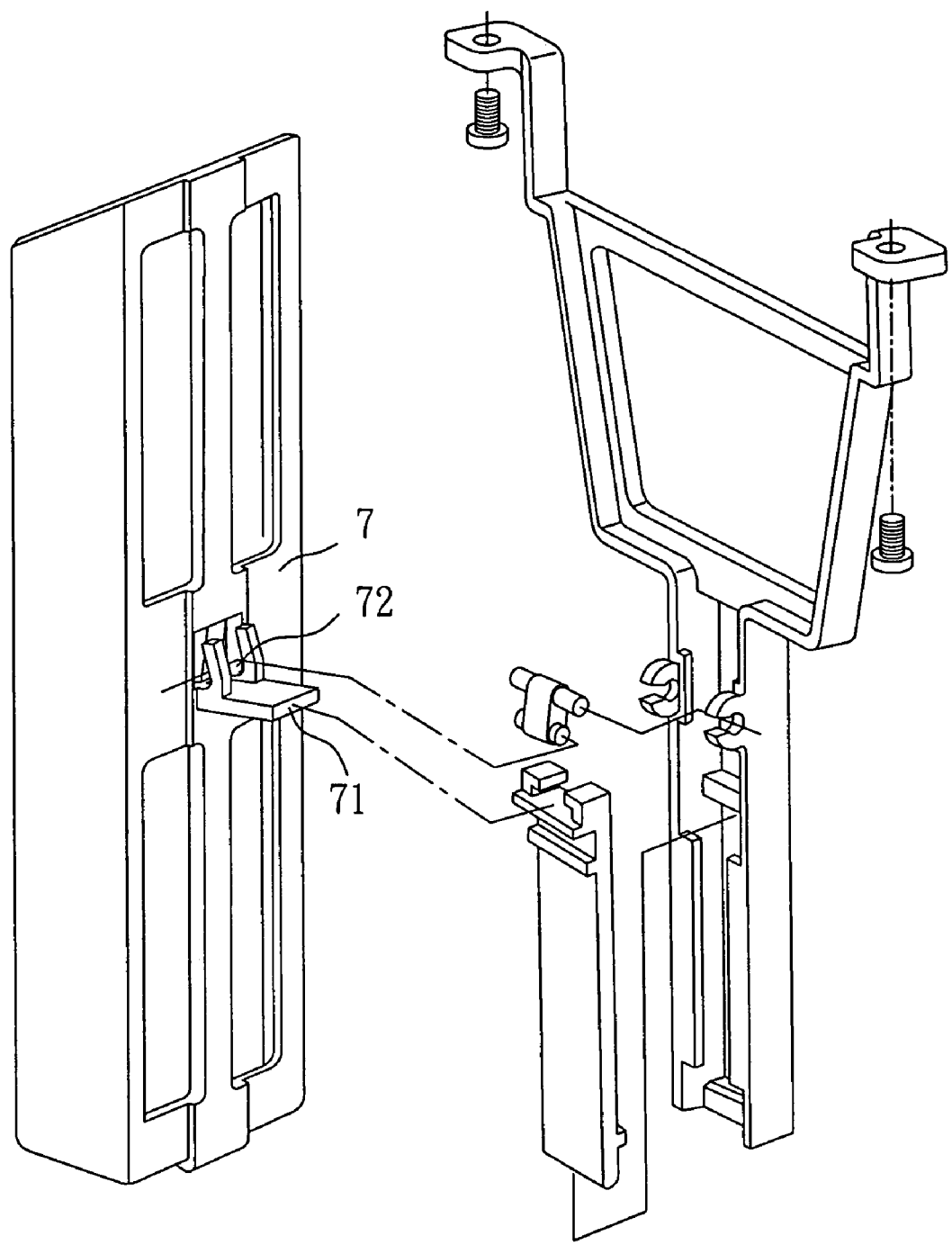
FIG. 5 is an exploded view of an alternate form of the workpiece holder according to the present invention.

FIG. 5 is an exploded view of an alternate form of the present invention. This embodiment is substantially similar to the aforesaid first embodiment of the present invention with the exception of that the horizontal sliding block 71 and the horizontal knuckles 72 of the holder member 7 are disposed at the same elevation, i.e., the horizontal knuckles 72 are formed integral with the horizontal sliding block 71. This embodiment achieves the same effect as provided by the aforesaid first embodiment of the present invention.

A prototype of workpiece holder for clean container has been constructed with the features of FIGS. 1~5. The workpiece holder for clean container functions smoothly to provide all of the features discussed earlier.

Although particular embodiments of the present invention have been described in detail for purposes of illustration, various modifications and enhancements may be made without departing from the spirit and scope of the invention. Accordingly, the invention is not to be limited except as by the appended claims.

What is claimed is:

1. A workpiece holder installed in a clean container, said clean container comprises a base, a cassette, and a housing, wherein said cassette is fixedly provided at a top side of said base and adapted to hold a number of workpieces that are transversely insertable into said cassette, said housing being adapted to cover said base over said cassette; said workpiece holder comprising:

a locating member fixedly fastened to an inside wall of said housing of said clean container, said locating member having a vertical sliding groove and a horizontal knuckle;

a vertical slide vertically movably inserted into said vertical sliding groove of said locating member, said vertical slide having a transversely horizontal sliding groove;

a holder member set between said locating member and said cassette, said holder member comprising a thrust face, a horizontal sliding block and a horizontal knuckle wherein said thrust face projects toward the workpieces and is adapted to push the workpieces in said cassette into position, said horizontal sliding block backwardly extending toward said vertical slide and being movably inserted into the corresponding horizontal sliding groove of said vertical slide; and a link, said link having a first pivot, and a second pivot, wherein said first pivot pivoted with the horizontal knuckle of said locating member, said second pivot pivoted with the horizontal knuckle of said holder member;

wherein when covering said housing on said base, a bottom side of said vertical slide is stopped at the top side of said base, and said locating member is continuously lowered with said housing, thereby causing said vertical slide to slide upwardly along the vertical sliding groove of said locating member, so as to turn said link upwardly subject to the first pivot, and at the same time said horizontal sliding block of said holder member slides forward in said horizontal sliding groove of said vertical slide, and the thrust face of said holder member pushes the inserted workpieces in said cassette into position.

2. The workpiece holder as claimed in claim 1, wherein said locating member has two mounting holes bilaterally disposed at a top side thereof and fastened to the inside wall of said housing with two screws respectively.

3. The workpiece holder as claimed in claim 1, wherein said holder member is a substantially U-shaped member, and said thrust face is symmetrically bilaterally disposed on said U-shaped member.

4. The workpiece holder as claimed in claim 1, wherein the horizontal knuckle of said holder member is formed integral with said horizontal sliding block.

5. The workpiece holder as claimed in claim 1, wherein said locating member comprises a stop disposed at a lateral edge of said vertical sliding groove; said vertical slide comprises a stop disposed at an upside thereof and corresponding to downwardly stop at the stop of said locating member to limit a downward moving distance of said vertical slide when sliding in said vertical sliding groove.

6. The workpiece holder as claimed in claim 1, wherein said locating member comprises a stop disposed in said vertical sliding groove; said vertical slide has a stop disposed near a bottom side thereof and corresponding to upwardly stop at the stop of said locating member.

7. The workpiece holder as claimed in claim 6, wherein the stop of said vertical slide is upwardly stopped at the stop of said locating member to limit an upward moving distance of said vertical slide when sliding in said vertical sliding groove.

8. The workpiece holder as claimed in claim 1, wherein the knuckle of said holder member is spaced from said horizontal sliding block at a pre-determined distance.

9. The workpiece holder as claimed in claim 1, wherein the knuckle of said holder member and said horizontal sliding block are disposed at a same elevation.

10. The workpiece holder as claimed in claim 1, wherein said locating member is affixed to the inside wall of said housing of said clean container with screws.

* * * * *